GLASS COVERED SEMICONDUCTOR DEVICE

Filed March 17, 1966

INVENTOR:
NORMAN E. DeVOLDER,
BY Robert J. Mooney
HIS ATTORNEY.

United States Patent Office 3,505,571

Patented Apr. 7, 1970

3,505,571

GLASS COVERED SEMICONDUCTOR DEVICE

Norman E. De Volder, Sodus Point, N.Y., assignor to General Electric Company, a corporation of New York Filed Mar. 17, 1966, Ser. No. 535,219
Int. Cl. H01l 3/00, 5/00, 9/00
U.S. Cl. 317—234 6 Claims

ABSTRACT OF THE DISCLOSURE

This invention relates to a semiconductor device consisting of a semiconductor body coated with a zinc oxide glass that forms an electrically stable seal on at least a portion of the body and has a thermal coefficient of expansion in the range of 3.75 to $4.50 \times 10^{-6}$ per degree centigrade. The composition of the zinc oxide glass in percent by weight is as follows: Zinc oxide, 50–70%; boron oxide, 20–30%; silicon dioxide, 5–15%; ceric oxide, 0.5–5%; and bismuth trioxide, 0.01–15%.

The present invention relates to improvements in semiconductor devices wherein the bodies of semiconductor material thereof are coated with, or encapsulated by, glass compositions.

In semiconductor devices including bodies of monocrystalline semiconductor material such as silicon, coating or encapsulation of the semiconductor material promotes reliability by not only protecting against mechanical damage but also providing a seal against harmful impurities, such as a water from the atmosphere. Glass has long been recognized as possessing certain properties desirable for encapsulation of such semiconductor materials, but heretofore glass encapsulants have not been available with the desired thermal expansion characteristics as well as requisite freedom from harmful effects on the electrical properties of the resultant device.

One object of the present invention is to provide an improved method of stabilizing the surface properties and electrical characteristics of bodies of semiconductor material, and of providing thereby semiconductor devices of uniformly superior and stable electrical characteristics.

Another object is to provide an improved semiconductor device having a body of monocrystalline semiconductor material coated with a glass having thermal expansion characteristics desirably matching the semiconductor material and providing a permanent protective sealing and passivating coating for the surface of the semiconductor material and for any PN junction extending to such surface.

Another object of the present invention is to provide an improved low-cost glass-encapsulated semiconductor diode.

Another object is to provide a semiconductor device of the foregoing character having extremely low leakage current, even under prolonged high temperature reverse bias conditions.

Another object is to provide a relatively low-cost semiconductor device of the foregoing character having extremely high reverse breakdown voltage capability, of the order of 1000 volts.

Another object is to provide, in combination with a body of semiconductor material having a PN junction extending to a surface thereof, a protective permanently hermetic coating of glass which can be applied at relative low cost and within a temperature range which is harmless both to the body of semiconductor material and external leads affixed thereto, and which does not degrade the electrical characteristics of the semiconductor material and is not deleteriously affected by temperatures required for soldering or the like.

Another object to provide an improved method for protectively coating and passivating monocrystalline silicon semiconductor material after such material is assembled with non-semiconductive elements in a device subassembly.

These and other objects of my invetnion will be apparent from the following description in conjunction with the accompanying drawings, wherein.

Figure 4:
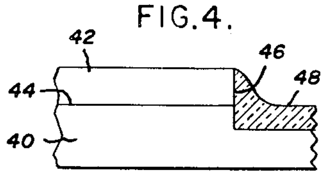
Figure 5:
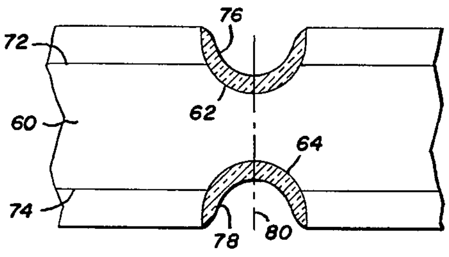

FIGURE 4 is a fragmentary sectional view of a monocrystalline body of semiconductor material having a mesa portion provided with a PN junction and covered and passivated with glass according to the present invention; and FIGURE 5 is a view similar to FIGURE 4 showing a semiconductor body having a plurality of glass-covered PN junctions according to my invention and ready for subdivision from a larger integral body of semiconductor material.

Figure 1:
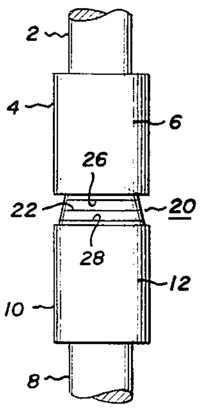
FIGURE 1 is a fragmentary axial sectional view of a monocrystalline PN junction semiconductor device subassembly suitable for encapsulation in accordance with one form of the present invention.

Referring to the drawing, FIGURE 1 shows a subassembly portion of a PN junction semiconductor diode constructed according to my invention. A first metal lead 2, which may consist of a wire of copper or copper alloy, is suitably connected, as for example by a butt-weld, to a somewhat larger diameter generally cylindrical heat sink electrode member 4 of molybdenum, tungsten, Kovar, or other metallic composition which suitably matches the thermal expansion properties of the intended semiconductor body of the diode. The heat sink member has a cylindrical sealing surface 6 which may have a diameter of, for example, .060 inch and a length of .080 inch. A second metal lead 8, which may be identical to the first metal lead, is likewise connected to a second heat sink electrode member 10 which may for convenience be identical to heat sink member 4 and has a cylindrical sealing surface 12.

The heat sink members 4, 10 are arranged in oppositely extending coaxial relation, and between them is a generally cylindrical pellet 20 of monocrystalline semiconductor material, such as silicon, which may have a diameter of, for example, .050 inch and a thickness of .008 inch. The pellet 20 may be appropriately doped, for example with boron and phosphorus, to provide a structure of the PN type, or PNN+ type, having a principal PN junction disposed in a plane generally parallel to the end faces of the pellet and extending to the surface of the side wall of the pellet at 22. If desired, the side wall of the pellet may be bevelled to a frusto-conical shape in the manner shown, with an appropriate bevel angle as known to those skilled in the art such as to reduce the peak field gradient at the pellet surface. Non-rectifying metallic contacts are provided on the pellet by metallic layers 26, 28 which may be, for example, aluminum vapor-deposited on the pellet end faces to a thickness of about .0003 inch. In addition to its function as an electrical contact, each metallic layer 26, 28 may also serve conveniently as a solder or fusible element for securely mechanically and electrically connecting the pellet to the respective heat sink members 4, 10. Fusion of the metallic layers 26, 28 with heat sink members 4, 10 and pellet 20 to complete the subassembly shown in FIGURE 1 may conveniently be accomplished by heating the subassembly to a temperature of about 700° C. for about 5 minutes, after which the subassembly is allowed to cool somewhat slowly so as to fall to about 200° C. in not less than about 30 to 45 minutes. When the metallic layers 26, 28 are aluminum, the N-type region of the pellet is preferably sufficiently heavily doped, to an impurity level of, for example, $1 \times 10^{21}$ impurity atoms per cm.$^3$, to insure that the aluminum contact thereon makes a non-rectifying connection. However, if desired, a thin layer of a non-doping metal barrier (not shown) may be vapor-deposited on the N-type semiconductor material beneath the aluminum metallic layer to insure a non-rectifying connection.

In accordance with the present invention, there is formed on the exposed surface of the semiconductor body, such as pellet 20 in FIGURE 1, a layer of a glass which wets and seals to the semiconductor body to form a suitably thermally matching, permanent gas-tight protecting and passivating, surface-stabilizing coating. Prior to application of the glass coating, to remove undesirable contaminants the semiconductor body and sealing surfaces of the heat sink members are cleaned by etching. The etching may be accomplished by immersing the subassembly such as shown in FIGURE 1 for a few seconds in a flowing stream of a CP-6 etching solution (consisting of 3 parts nitric acid, 1 part acetic acid, and 1 part hydrofluoric acid), immediately following which the subassembly is rinsed in deionized water and allowed to dry. Drying in clean air, or an inert gas such as nitrogen, is satisfactory.

Glass suitably satisfying the requirements of a coating material in accordance with the present invention has the following composition by weight, as calculated from the constituents forming a batch:

| | Percent |
|---|---|
| Zinc oxide (ZnO) | 50–70 |
| Boron oxide ($B_2O_3$) | 20–30 |
| Silicon dioxide ($SiO_2$) | 5–15 |
| Ceric oxide ($CeO_2$) | 0.5–5 |
| Bismuth trioxide ($Bi_2O_3$) | .01–15 |
| Lead oxide (PbO) | 0.5–5.0 |
| Antimony trioxide ($Sb_2O_3$) | 0.1–2.0 |

One preferred glass according to the present invention has the following composition by weight, as calculated from the constituents forming a batch:

| | Percent |
|---|---|
| Zinc oxide (ZnO) | 60 |
| Boron oxide ($B_2O_3$) | 25 |
| Silicon dioxide ($SiO_2$) | 9.4 |
| Ceric oxide ($CeO_2$) | 3 |
| Bismuth trioxide ($Bi_2O_3$) | 0.1 |
| Lead oxide (PbO) | 2 |
| Antimony trioxide ($Sb_2O_3$) | 0.5 |

Such preferred glass has, in the vitreous state, the following properties:

Fiber softening point—635° C.
Liquidus temperature—1030° C.
Coefficient of thermal expansion (0–300° C.)—$4.45 \times 10^{-6}$/° C.
Electrical resistivity, ohm centimeters (350° C.)—$10^{11}$
Electrical resistivity, ohm centimeters (300° C.)—$10^{12}$
Electrical resistivity, ohm centimeters (250° C.)—$10^{13.3}$
Dielectric constant at room temperature and one megahertz frequency—8.1
Dielectric dissipation factor at room temperature and one megahertz frequency—.00138

For use according to the present invention, glass of the foregoing composition is provided in a finely divided form, for example by ball milling or other suitable powdering technique, so as to have a particle size of less than about 40 to 50 microns particle diameter. The degree of devitrification of such glass is controllable in accordance with the temperature and duration of heating to which it is subjected after the glass is first made. When the glass is in the finely divided or powdered form described, nucleation occurs throughout the mass formed when the glass powder is sintered at a temperature of 600° C. for twenty to thirty minutes. Since the thermal coefficient of expansion of the glass is reduced as the degree of devitrification is increased, the coefficient of thermal expansion may be changed by suitable heat treatment of the glass in the form of powder. For example, graphite molds having rod-shaped cavities 9 inches long, ¼ inch wide and ⅛ inch deep were filled with glass powder having the above-mentioned preferred composition and a particle size such as to pass through a minus 325 mesh, i.e. smaller than 44 microns diameter. The glass powder while in the mold was heated in air in an electric furnace to a temperature of 600° C. and held at this temperature for twenty to thirty minutes to sinter each glass rod into a coherent body. This heat treatment provoked nucleation of the sintered glass. The heat treatment of a plurality of such rods was continued without interruption for various times and temperatures to promote various degrees of devitrification and crystal growth, with the following results on the appearance and coefficients of thermal expansion of the various samples:

| Rod | Heat Treatment | Appearance | Linear Expansion (0–300° C.) |
|---|---|---|---|
| #1 | 600° C. for 30 min,, raised to 650° C. in 10 min., held at 650° C. about 20 minutes. | Vitreous yellow | $4.49 \times 10^{-6}$/° C. |
| #2 | 600° C. for 30 min., raised to 700° C. in 15 min., held at 700° C. for 15 minutes. | do | $4.28 \times 10^{-6}$/° C. |
| #3 | 600° C. for 30 min., raised to 750° C. in 25 min., held at 750° C. for 5 minutes. | Matte slightly yellow | $4.06 \times 10^{-6}$/° C. |
| #4 | 600° C. for 20 min., raised to 650° C. in 10 min., raised to 700° C. in 10 min., raised to 750° C. in 10 min., raised to 800° C. in 10 minutes. | Matte yellow | $3.83 \times 10^{-6}$/° C. |
| #5 | 600° C. for 20 min., raised to 650° C. in 10 min., raised to 700° C. in 10 min., raised to 750° C. in 10 min., raised to 800° C. in 10 min., raised to 850° C. in 20 minutes. | Matte buff-colored | $3.75 \times 10^{-6}$/° C. |
| #6 | 600° C. for 20 min., raised to 650° C. in 10 min., raised to 700° C. in 10 min., raised to 750° C. in 10 min., raised to 800° C. in 10 min., raised to 850° C. in 10 min., raised to 900° C. in 10 minutes. | Matte slightly-buff-colored. | $3.75 \times 10^{-6}$/° C. |

Thus the coefficient of thermal expansion of the glass may be controlled by heat treatments such as described above to have a value suitably compatible with that of the semiconductor body to which it is to be applied, such as pellet 20 of FIGURE 1, as well as with any related heat transfer members, such as heat sink members 4, 10 of FIGURE 1, within the range of $3.75 \times 10^{-6}$ per degree centrigrade to $4.49 \times 10^{-6}$ per degree centigrade.

The glass may be applied to the body of semiconductor material in the following manner. Glass of composition as above described is provided in powder form, having an average particle size of not more than about 44 microns diameter. The powder is mixed with a vehicle of deionized water at room temperature to form a suspension or slurry. The ratio of glass to vehicle should be such as to provide a coating which will stay in place after application long enough for the vehicle to be evaporated and the glass powder heated enough to cause it to coalesce into a vitreous mass. A suitable composition for such a slurry is 4 parts glass powder by weight to 1 part water by weight. The slurry may be applied with a suitable dispenser, such as an eye-dropper.

Figure 2:
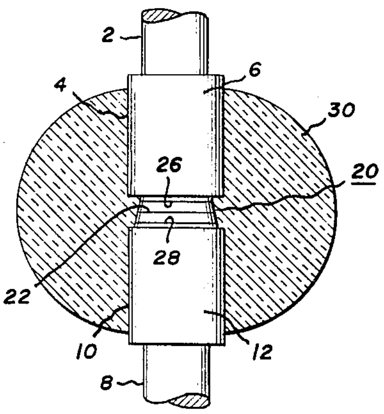
FIGURE 2 is a view similar to FIGURE 1 showing the subassembly of FIGURE 1 at an intermediate stage of application of a glass encapsulation thereto in accordance with the present invention.
Figure 3:
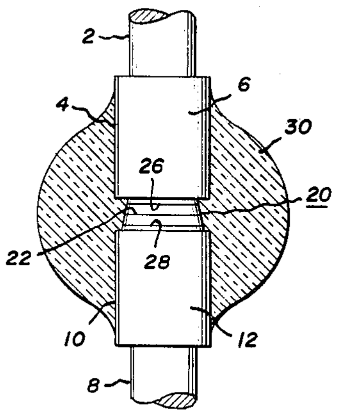
FIGURE 3 is a view similar to FIGURES 1 and 2 showing the device after completion of the encapsulation process.

After application of a coating of the glass slurry 30, the resulting assembly appears as shown in FIGURE 2. The applied slurry 30 is allowed to dry in air, which may if desired be warmed to 40° C. or so, for a few minutes sufficient to evaporate the water vehicle. Thereupon, heating the glass-coated assembly to a temperature within the range of about 700° C. to 800° C., for example by passage of the assembly through a tunnel oven, is effective for melting and coalescing the glass particles into an integral mass which wets and seals to the underlying surface. The length of time which the glass should be held at such elevated temperatures depends upon several factors, namely the amount of glass present, the thickness of the coating, and the amount of devitrification desired, and such heating time may vary from a few minutes to several hours depending on such factors With the device of FIGURES 2 and 3, for example, using molybdenum heat sink members, a heating time at 750° C. of about five minutes has been found to give excellent results. In order to prevent oxidation of the metal heat sink members 4, 10 at the elevated temperatures to which they are subjected before the glass powder has coalesced into a vitreous mass and formed a protective sealing coating thereon, the vitrification heating may be done in an inert or non-reducing atmosphere, such as nitrogen or air. Formation of small bubbles in the glass, of a size corresponding for example to several thousand per cubic millimeter, is unobjectionable, but larger bubbles are to be avoided because of their possible adverse effect on the uniformly high dielectric strength of the finished glass coating. After the glass powder has coalesced into the desired vitreous mass, devitrification to the desired extent may be effected by further heating, in accordance with the schedule of heat treatment hereinabove set forth. In a structure such as shown in FIGURES 2 and 3, the glass should preferably be devitrified enough to give it a thermal coefficient of expansion slightly less than that of the heat sink members 4, 10. For example, with heat sink members of molybdenum having a thermal coefficient of $4.9 \times 10^{-6}$/°C., a suitable glass final thermal coefficient is $4.3 \times 10^{-6}$/°C.

After slurry coating and firing of one layer of glass is accomplished, further coats of slurry may be applied and fired as desired to produce an ultimate coating of whatever total thickness is desired. To preclude pin-holes, a thickness of at least 10,000 Angstroms is desirable, and a thickness of several mils or more may be provided if desired.

FIGURE 4 shows another embodiment of my invention wherein a body of monocrystalline silicon semiconductive material 40 has a mesa portion 42 in which there is a PN junction 44 extending to the surface at the side wall 46 of the mesa. A layer of glass 48 of the foregoing composition is applied as heretofore described to cover the surface of the semiconductor body in at least the locus of the junction. FIGURE 5 shows a semiconducted body 60 having opposed grooves 62, 64, which may be formed for example by etching from both faces simultaneously and which tend to balance and equalize stresses in the semiconductor body. PN junctions 72, 74 in the body exposed by the grooves are covered by glass coatings 76, 78 applied to the groove walls as hereinbefore described. The glass-coated semiconductor body may be subdivided, or pelletized, by sawing or otherwise fracturing at the reference line 80, thereby forming a plurality of individual pellets having junctions permanently hermetically sealed by glass coatings.

A glass encapsulated device and process provided as above described has many advantages. First, surface leakage current on the semiconductor body is reduced to a level approaching the minimum attainable theoretically, based on such factors as pellet size, diffusion geometry, impurity levels, and junction temperature. Moreover, the thermal coefficient of the glass can be adjusted to provide the desired match with that of the semiconductor body and heat sink members, for excellent thermal shock capability. For example, it has been found that a device as shown in FIGURE 3 will repeatedly withstand abrupt temperature excursions between −196° C. and +250° C. Additionally, the glass melts at a low enough temperature, below the eutectic temperature of the semiconductor body and metallic contact layers 26, 28, to avoid disturbing the fused metal bond between the silicon and heat sink members. Finally, the glass forms a hermetic seal of extreme moisture impermeability and high dielectric strength capable of supporting a high electric field at the semiconductor body surface. A glass coating as thin as, for example, 10,000 A., shows no evidence of moisture penetration after steam treatment in an autoclave under 15 p.s.i. of steam for one hour.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. In a semiconductor device, a body of monocrystalline silicon semiconductor material, and a coating directly on the surface of at least a portion of said body of sintered particles of a zinc oxide glass having a thermal coefficient of expansion in the range of 3.75 to $4.50 \times 10^{-6}$ per degree centigrade, said coating particles having a particle size less than about 50 microns diameter, said gloss having essentially the following composition, in percent by weight:

| | Percent |
|---|---|
| Zinc oxide (ZnO) | 50–70 |
| Boron oxide ($B_2O_3$) | 20–30 |
| Silicon dioxide ($SiO_2$) | 5–15 |
| Ceric oxide ($CeO_2$) | 0.5–5 |
| Bismuth trioxide ($Bi_2O_3$) | 0.01–15 |

and said glass forming an electrically stable seal with said body.

2. In a semiconductor device a body of monocrystalline silicon semiconductor material including a PN junction extending to the surface of said body and a glass passivating coating completely covering and directly contiguous with at least said PN junction wherein said glass having essentially the following composition, in percent by weight:

| | Percent |
|---|---|
| Zinc oxide (ZnO) | 50–70 |
| Boron oxide ($B_2O_3$) | 20–30 |
| Silicon dioxide ($SiO_2$) | 5–15 |
| Ceric oxide ($CeO_2$) | 0.5–5 |
| Bismuth trioxide ($Bi_2O_3$) | 0.01–15 |

and said glass forming an electrically stable seal with said body.

3. In a semiconductor device, a body of monocrystalline semiconductor material, and a coating on at least a portion of said body of sintered particles of a zinc oxide glass having a thermal coefficient of expansion in the range of 3.75 to $4.50 \times 10^{-6}$ per degree centigrade and having essentially the following composition, in percent by weight:

| | Percent |
|---|---|
| Zinc oxide ($ZnO$) | 50–70 |
| Boron oxide ($B_2O_3$) | 20–30 |
| Silicon dioxide ($SiO_2$) | 5–15 |
| Ceric oxide ($CeO_2$) | 0.5–5 |
| Bismuth trioxide ($Bi_2O_3$) | 0.01–15 |
| Lead oxide ($PbO$) | 0.5–5 |
| Antimony trioxide ($Sb_2O_3$) | 0.1–2 |

and said glass forming an electrically stable seal with said body.

4. A semiconductor device as defined in claim 1 wherein said semiconductor body includes an N-type region and a P-type region between which is a PN junction extending to the surface of said body beneath said glass coating, said body having side walls being beveled to a frusto-conical shape, and respective aluminum contacts are provided fused onto said respective N-type and P-type regions.

5. A semiconductor device as defined in claim 4 wherein each of said aluminum contacts is bonded to a respective heat sink electrode member selected from the class consisting of molybdenum, tungsten and Kovar, and said glass coating extends partially over and in sealing relation with each of said heat sink electrode members.

6. A semiconductor device as defined in claim 5 wherein said heat sink electrode members are molybdenum and respective copper alloy leads extend from said respective heat sink electrode members.

References Cited

UNITED STATES PATENTS

| | | | |
|---|---|---|---|
| 2,889,952 | 6/1959 | Claypoole | 313—317 X |
| 3,113,878 | 12/1963 | Martin | 313—317 X |
| 3,250,631 | 5/1966 | Lusher | 106—49 X |
| 3,256,136 | 6/1966 | Cole et al. | 106—49 X |
| 3,307,958 | 3/1967 | Earl | 106—49 |
| 3,392,312 | 7/1968 | Carman | 317—234 |
| 3,408,212 | 10/1968 | Dumesnil | 317—234 |
| 2,971,853 | 2/1961 | Stookey | 317—234 |
| 3,050,666 | 8/1962 | Stump | 317—234 |
| 3,241,010 | 3/1966 | Eddleston | 317—234 |
| 3,300,339 | 1/1967 | Perri et al. | 317—234 |
| 3,303,399 | 2/1967 | Hoogendoorn et al. | 317—234 |
| 3,317,653 | 5/1967 | Layer et al. | 317—234 |

JOHN W. HUCKERT, Primary Examiner

A. J. JAMES, Assistant Examiner

U.S. Cl. X.R.

106—39, 49, 54; 317—235

UNITED STATES PATENT OFFICE
CERTIFICATE OF CORRECTION

Patent No. 3,505,571 April 7, 1970

Norman E. De Volder

It is certified that error appears in the above identified patent and that said Letters Patent are hereby corrected as shown below:

Column 2, line 3, after "object" insert -- is --. Column 6, line 2, "semiconducted" should read -- semiconductor --; line 51, "gloss" should read -- glass --.

Signed and sealed this 12th day of January 1971.

(SEAL)
Attest:

Edward M. Fletcher, Jr.
Attesting Officer

WILLIAM E. SCHUYLER, JR.
Commissioner of Patents